United States Patent
Kasahara et al.

(10) Patent No.: US 8,255,441 B2
(45) Date of Patent: Aug. 28, 2012

(54) FIGURE DATA VERIFICATION APPARATUS AND METHOD THEREFOR

(75) Inventors: Jun Kasahara, Kanagawa (JP); Shigehiro Hara, Kanagawa (JP); Shinji Sakamoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 1268 days.

(21) Appl. No.: 11/971,445

(22) Filed: Jan. 9, 2008

(65) Prior Publication Data
US 2008/0172438 A1  Jul. 17, 2008

(30) Foreign Application Priority Data
Jan. 16, 2007  (JP) ................. 2007-007082

(51) Int. Cl.
*G06F 7/10* (2006.01)

(52) U.S. Cl. .................................... 708/200

(58) Field of Classification Search .............. 708/200
See application file for complete search history.

(56) References Cited

U.S. PATENT DOCUMENTS 7,155,698 B1 * 12/2006 Gennari ............................. 716/53
2005/0065735 A1 * 3/2005 Lee et al. .......................... 702/19

FOREIGN PATENT DOCUMENTS

JP  2001-344302  12/2001
JP  2005-79392   3/2005

* cited by examiner

*Primary Examiner* — Tan V. Mai
(74) *Attorney, Agent, or Firm* — Oblon, Spivak, McClelland, Maier & Neustadt, L.L.P.

(57) ABSTRACT

A figure data verification apparatus includes an operation part configured to input design data and writing data converted from the design data and perform an exclusive OR operation between data of a figure included in the design data and data of a figure included in the writing data, a sorting part configured to sort figures produced as a result of the exclusive OR operation to at least one arbitrary-angle figure having at least one angle not being an integral multiple of 45 degrees and to at least one non-arbitrary-angle figure all angles of which are integral multiples of 45 degrees, a first removal part configured to remove a figure of a size smaller than a first allowable error value from the arbitrary-angle figure, and a second removal part configured to remove a figure of a size smaller than a second allowable error value from the non-arbitrary-angle figure.

10 Claims, 14 Drawing Sheets

FIGURE DATA VERIFICATION APPARATUS AND METHOD THEREFOR

CROSS-REFERENCE TO RELATED APPLICATION

This application is based upon and claims the benefit of priority from the prior Japanese Patent Application No. 2007-007082 filed on Jan. 16, 2007 in Japan, the entire contents of which are incorporated herein by reference.

BACKGROUND OF THE INVENTION

1. Field of the Invention

The present invention relates to a verification apparatus and method for figure data. For example, the present invention relates to a verification apparatus and method for figure data defined by writing data used for electron beam writing.

2. Description of the Related Art

Microlithography technique, which forwards miniaturization of semiconductor devices, is extremely important because only this process performs forming a pattern in semiconductor manufacturing processes. In recent years, with an increase in high integration and large capacity of large-scale integrated circuits (LSI), a circuit line width required for semiconductor elements is becoming narrower and narrower. In order to form desired circuit patterns on these semiconductor devices, a master pattern (also called a mask or a reticle) with high precision is required. Then, since the electron beam technique for writing or "drawing" a figure has excellent resolution essentially, it is used for manufacturing such high precision master patterns.

FIG. 17 shows a schematic diagram describing operations of a conventional variable-shaped electron beam (EB) pattern writing apparatus. In the variable-shaped electron beam pattern writing apparatus, writing is performed as follows: A first aperture plate 410 has an opening or "hole" 411 in the shape of a rectangle, for example, for shaping an electron beam 330. This shape of the rectangular opening may also be a square, a rhombus, a rhomboid, etc. A second aperture plate 420 has a variable-shaped opening 421 for shaping the electron beam 330 having passed through the opening 411 410 into a desired rectangular. The electron beam 330 that left a charge particle source 430 and has passed through the opening 411 is deflected by a deflector. Then, the electron beam 330 passes through a part of the variable-shaped opening 421, and irradiates a target workpiece or "sample" 340 mounted on a stage that is continuously moving in one predetermined direction (e.g. X-axis direction). In other words, a rectangular shape capable of passing through both the opening 411 and the variable-shaped opening 421 is written in a writing region of the target workpiece 340. This method of writing or "forming" a given shape by letting beams pass through both the opening 411 and the variable-shaped opening 421 is referred to as a "variable shaping" method. The electron beam pattern writing apparatus of variable shaping type is disclosed in articles.

In performing electron beam writing, first a layout of a semiconductor integrated circuit is designed, and layout data (design data) for writing the design is generated. Then, the layout data is converted to generate writing data to be input into an electron beam pattern writing apparatus. Further, the writing data is converted into data of a format to be used in the electron beam pattern writing apparatus to write a pattern.

As a method for verifying whether EB data generated by converting CAD data is in accordance with the original CAD data or not, the following is disclosed in an article which describes an electron beam exposure apparatus. An exclusive OR (XOR) operation, etc. are performed between LSI design data (CAD data) and EB data generated by converting the LSI design data. Then, it is judged based on an output of the XOR operation whether the number of figures is 0 or not. When the number of figures is not 0, it operates so as to efficiently judge whether there was any conversion error at the time of data conversion or not (for example, refer to Japanese Unexamined Patent Publication No. 2001-344302 (JP-A-2001-344302)).

When converting design data into writing data, a figure which cannot be formed by using the shape of a beam forming aperture plate is approximated to a figure in accordance with the shape of the beam forming aperture plate. For example, when a pattern writing apparatus has an aperture of a triangle or a rectangle with an angle of 45 degrees, an arbitrary-angle figure that means a triangle or a rectangle having at least one angle not being an integral multiple of 45 degrees is divided into trapezoids or rectangles with an angle being an integral multiple of 45 degrees. More specifically, the triangle or a rectangle having the diagonal line portion at the angle not being an integral multiple of 45 degrees of the arbitrary-angle figure is divided into trapezoids or rectangles with an angle being an integral multiple of 45 degrees. This dividing is herein called a slit-like dividing or a slit-like division.

FIG. 18 shows an example of the design data. CAD data 210 shown in FIG. 18 is mixedly composed of non-arbitrary-angle figures 214 and 215 that mean a triangle or a rectangle all angles of which are integral multiples of 45 degrees, a figure group 217 and an arbitrary-angle figure 216.

FIG. 19 shows an example of the writing data after the conversion. Writing data 220 shown in FIG. 19 is mixedly composed of non-arbitrary-angle figures 223, 225 and 228, a figure group 227, and a slit-like divided figure group 226 being a non-arbitrary-angle figure group made by slit-like dividing the arbitrary-angle figure. The figure 228 is smaller than each figure constituting the figure group 226.

An exclusive OR (XOR) operation is performed as data verification after the conversion. If a position, a shape, etc. of a figure in the data do not change before and after the data conversion, the number of figures should become zero as the operation result. Therefore, when no figure is output as the operation result, it can be thought that no conversion error (defect) was generated. However, in the case of actually converting data, it is necessary to perform processing such as approximating an arbitrary-angle figure by a slit-like division, and converting values depending upon a change of an address unit (AU). For this reason, an operation result in a mixed state is output. Concretely, in the operation result, an error portion of the approximated figure (arbitrary-angle figure), a conversion error portion of the address unit (AU), and a conversion error portion (defect portion) which is required to obtain are intermingled. This mixed result is usually displayed on a monitor, etc. to be visually checked by a user. However, when a large number of figures are displayed as the operation result, there is a limit in judging all the figures visually. Furthermore, there is a problem in that such checking takes a lot of time and there may be checking omission.

Accordingly, it has been tried to remove figures smaller than a certain size in order to remove allowable error portions and to reduce the number of figures. FIG. 20 shows an example of the operation result. As shown in FIG. 20, figures 244 and 246 are illustrated as discrepancy portions having displacement between the figure 214 and the displaced figure 223. A figure 228, which does not exist in the design data 210 but is generated by some sort of defect in the writing data 220, is also shown as a discrepancy portion. Moreover, an arbitrary-angle figure group 242 is shown as a discrepancy portion having displacement between the arbitrary-angle figure 216 and the slit-like divided figure group 226. For the sake of brevity, it is assumed herein that no AU error is generated in the conversion. The approximation by slit-like dividing the arbitrary-angle figure is executed so that a figure difference before and after the conversion may be within a predetermined allowable error. Therefore, if a figure at the discrepancy portion of the arbitrary-angle figure outputted as the operation result is within the allowable error, the figure can be disregarded as an error. In order to remove an error portion within the allowable error of the arbitrary-angle figure, figures of the size equal to or smaller than the allowable error are deleted. Such operation result is shown in FIG. 21. According to this method, however, it becomes difficult to find other error figures smaller than the allowable error value of the arbitrary-angle figure. For example, in the case shown in FIG. 21, though the figure 228 is an error figure intrinsically, it is impossible to detect it.

BRIEF SUMMARY OF THE INVENTION

It is an object of the present to provide a verification method for highly precisely verifying a conversion error.

In accordance with one aspect of the present invention, a figure data verification apparatus includes a first sorting part configured to input design data and sort figures included in the design data to at least one arbitrary-angle figure having at least one angle not being an integral multiple of 45 degrees and to at least one non-arbitrary-angle figure all angles of which are integral multiples of 45 degrees, a second sorting part configured to input writing data converted from the design data, and sort figures included in the writing data to at least one first figure corresponding to the at least one arbitrary-angle figure and to at least one second figure corresponding to the at least one non-arbitrary-angle figure, a first operation part configured to perform an exclusive OR operation between data of the arbitrary-angle figure and data of the first figure, a second operation part configured to perform an exclusive OR operation between data of the non-arbitrary-angle figure and data of the second figure, a first removal part configured to remove a figure of a size smaller than a first allowable error value from at least one figure produced as a result of the exclusive OR operation between the data of the arbitrary-angle figure and the data of the first figure, and a second removal part configured to remove a figure of a size smaller than a second allowable error value from at least one figure produced as a result of the exclusive OR operation between the data of the non-arbitrary-angle figure and the data of the second figure.

In accordance with another aspect of the present invention, a figure data verification apparatus includes an operation part configured to input design data and writing data converted from the design data and perform an exclusive OR operation between data of a figure included in the design data and data of a figure included in the writing data, a sorting part configured to sort figures produced as a result of the exclusive OR operation to at least one arbitrary-angle figure having at least one angle not being an integral multiple of 45 degrees and to at least one non-arbitrary-angle figure all angles of which are integral multiples of 45 degrees, a first removal part configured to remove a figure of a size smaller than a first allowable error value from the at least one arbitrary-angle figure, and a second removal part configured to remove a figure of a size smaller than a second allowable error value from the at least one non-arbitrary-angle figure.

Moreover, in accordance with another aspect of the present invention, a figure data verification method includes inputting design data, inputting writing data converted from the design data, sorting figures included in the design data to at least one arbitrary-angle figure having at least one angle not being an integral multiple of 45 degrees and to at least one non-arbitrary-angle figure all angles of which are integral multiples of 45 degrees, sorting figures included in the writing data to at least one first figure corresponding to the at least one arbitrary-angle figure and to at least one second figure corresponding to the at least one non-arbitrary-angle figure, performing an exclusive OR operation between data of the arbitrary-angle figure and data of the first figure, performing an exclusive OR operation between data of the non-arbitrary-angle figure and data of the second figure, removing a figure of a size smaller than a first allowable error value from at least one figure produced as a result of the exclusive OR operation between the data of the arbitrary-angle figure and the data of the first figure, and removing a figure of a size smaller than a second allowable error value from at least one figure produced as a result of the exclusive OR operation between the data of the non-arbitrary-angle figure and the data of the second figure.

Furthermore, in accordance with another aspect of the present invention, a figure data verification method includes inputting design data, inputting writing data converted from the design data, performing an exclusive OR operation between data of a figure included in the design data and data of a figure included in the writing data, sorting figures produced as a result of the exclusive OR operation to at least one arbitrary-angle figure having at least one angle not being an integral multiple of 45 degrees and to at least one non-arbitrary-angle figure all angles of which are integral multiples of 45 degrees, removing a figure of a size smaller than a first allowable error value from the at least one arbitrary-angle figure, and removing a figure of a size smaller than a second allowable error value from the at least one non-arbitrary-angle figure.

BRIEF DESCRIPTION OF THE WRITINGS

DETAILED DESCRIPTION OF THE INVENTION

In the following Embodiments, a structure using an electron ray (electron beam) as an example of a charged particle ray (charged particle beam) will be described. The charged particle ray is not restricted to the electron ray, but may be a beam using other charged particle, such as an ion beam.

Embodiment 1

Figure 1:
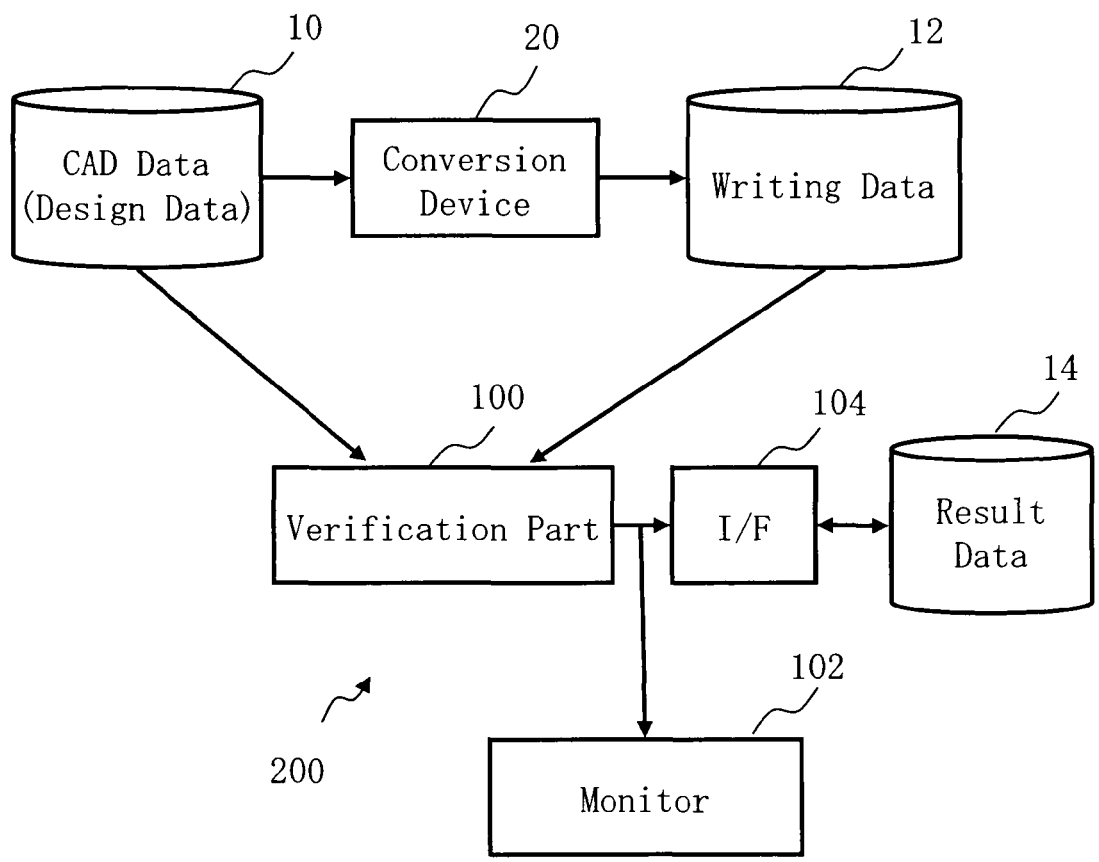
FIG. 1 is a schematic diagram showing an example of a system configuration described in Embodiment 1.

FIG. 1 is a schematic diagram showing an example of a system configuration described in Embodiment 1. As shown in FIG. 1, a layout of a semiconductor integrated circuit is designed first. Then, CAD data (design data) 10 used as layout data is generated. The CAD data 10 is converted in a conversion device 20 to generate writing data 12 to be input into an electron beam pattern writing apparatus. The writing data 12 is converted into input format data of the electron beam pattern writing apparatus which writes a figure pattern onto a target workpiece by using an electron beam. Further, the writing data 12 is converted to data of a format to be used in the electron beam pattern writing apparatus to write a pattern. A data verification apparatus 200 verifies whether there is any difference between the CAD data 10 and the writing data 12 which is converted from the CAD data. The data verification apparatus 200 includes a verification part 100, a monitor 102, and an interface (I/F) circuit 104. The verification part 100 inputs the CAD data 10 and the writing data 12, performs an exclusive OR (XOR) operation, and outputs a result data 14 to the outside through the I/F circuit 104 or displays the result data 14 on the monitor 102. It is possible for the user to verify a figure accordance or discordance before and after the conversion by checking the result data 14.

Figure 2:
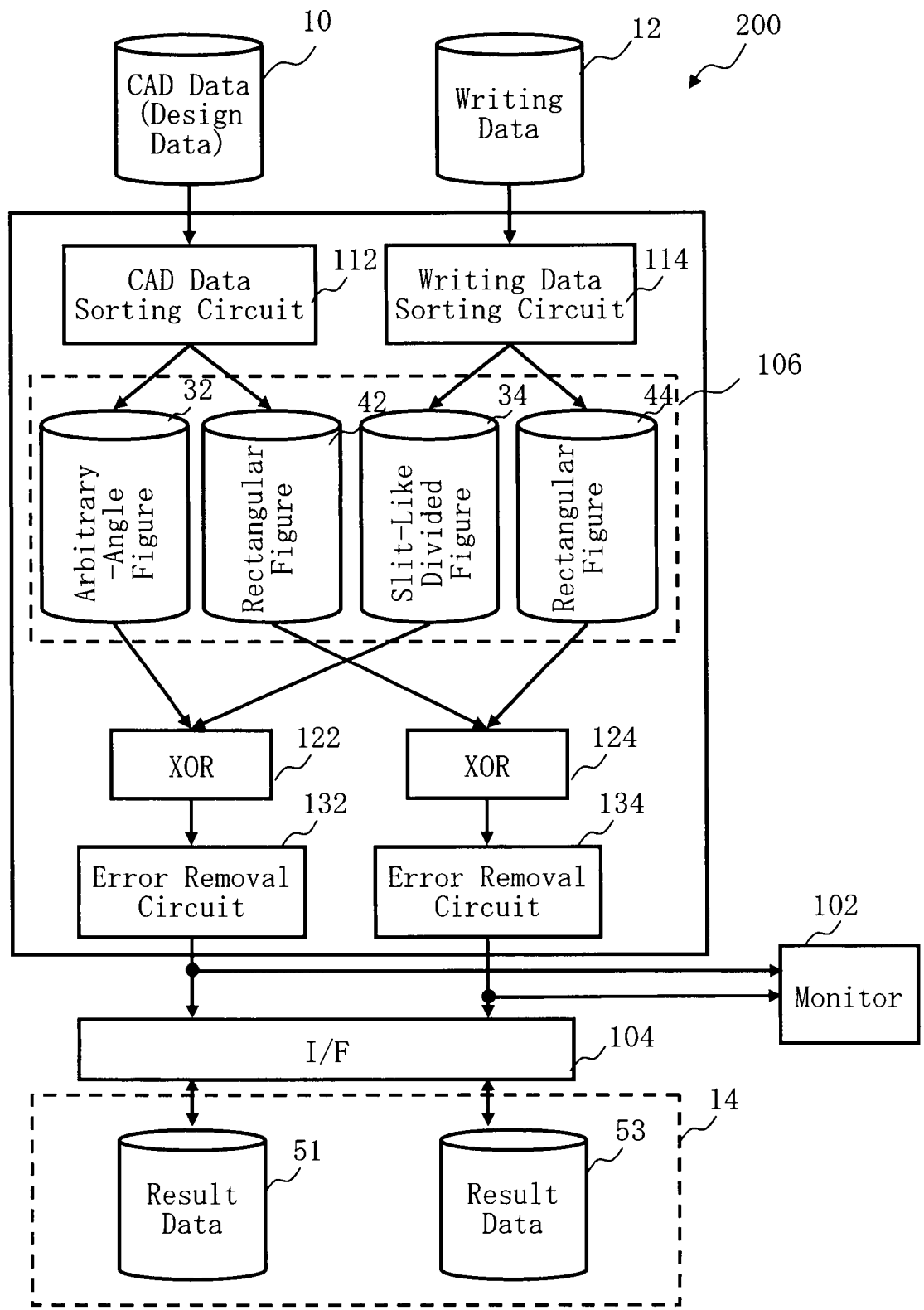
FIG. 2 is a schematic diagram showing an example of an internal structure of a data verification apparatus described in Embodiment 1.

FIG. 2 is a schematic diagram showing an example of the internal structure of a data verification apparatus described in Embodiment 1. The verification part 100 in FIG. 2 includes a CAD data sorting circuit 112 (first sorting part), a writing data sorting circuit 114 (second sorting part), a memory 106, an XOR operation circuit 122 (first operation part), an XOR operation circuit 124 (second operation part), an error removal circuit 132 (first removal part), and an error removal circuit 134 (second removal part).

First, as an input step, the verification part 100 inputs the CAD data 10. Then, the inputted CAD data 10 is sent to the CAD data sorting circuit 112. On the other hand, the verification part 100 inputs the writing data 12 which was converted from the CAD data 10.

Figure 3:
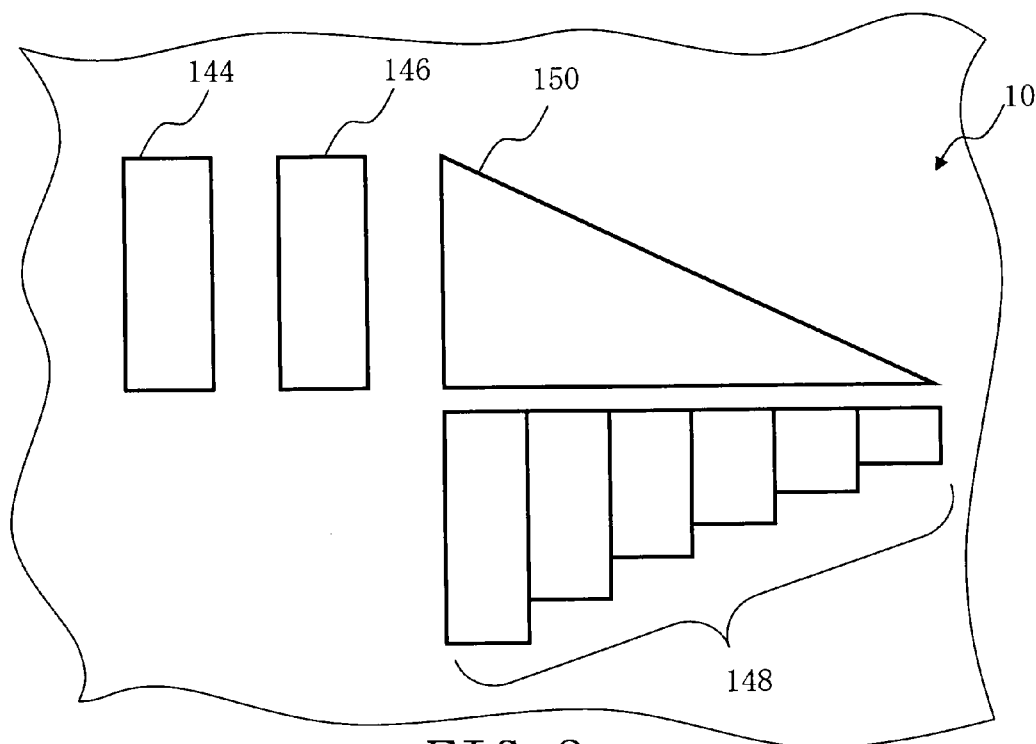
FIG. 3 shows an example of a figure included in CAD data described in Embodiment 1.

FIG. 3 shows an example of figures included in the CAD data according to Embodiment 1. As shown in FIG. 3, an arbitrary-angle figure 150, meaning a figure having at least one angle not being an integral multiple of 45 degrees, non-arbitrary-angle figures 144 and 146, and a figure group 148 are mixed in the CAD data 10. The arbitrary-angle figure herein means a figure having an angle portion which cannot be formed by using the beam forming aperture plate of the pattern writing apparatus. For example, if the pattern writing apparatus has a beam forming aperture plate which can form angles of 45 degrees and 90 degrees, the arbitrary angle θ is to be other than 45 degrees and 90 degrees, that is 0°<θ<45°, 45°<θ<90°, 90°<θ<135°, 135°<θ<180°, 180°<θ<225°, 225°<θ<270°, 270°<θ<315°, and 315°<θ<360°. Then, the non-arbitrary angle is an integral multiple of 45 degrees that can be formed by the beam forming aperture plate. Moreover, for example, if the pattern writing apparatus has a beam forming aperture plate which can form only an angle of 90 degrees, the arbitrary angle θ is to be other than 90 degrees, that is 0°<θ<90°, 90°<θ<180°, 180°<θ<270°, and 270°<θ<360°. In this case, the non-arbitrary angle is 90 degrees which can be formed by the beam forming aperture plate.

Figure 4:
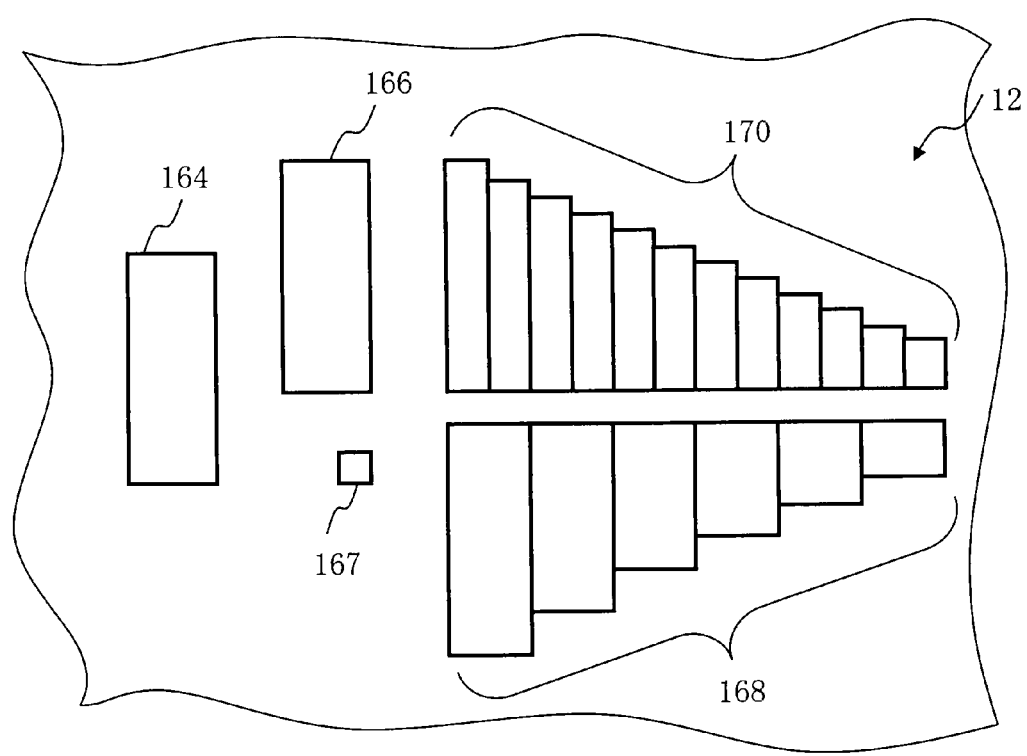
FIG. 4 shows an example of a figure included in writing data after conversion described in Embodiment 1.

FIG. 4 shows an example of figures included in the writing data after the conversion described in Embodiment 1. As shown in FIG. 4, non-arbitrary-angle figures 164, 166, and 167, a figure group 168, and a slit-like divided figure group 170 of non-arbitrary-angle figures made by slit-like dividing the arbitrary-angle figure are mixed in the writing data 12. At the time of conversion, a figure with an angle larger than 90 degrees is divided into a combination of trapezoids and/or rectangles with the angles of 40, 90, and 130 degrees according to need.

The inputted writing data 12 is sent to the writing data sorting circuit 114. In FIG. 2, although the data is directly input into each sorting circuit, it may be input through the I/F circuit 104.

Figure 5:
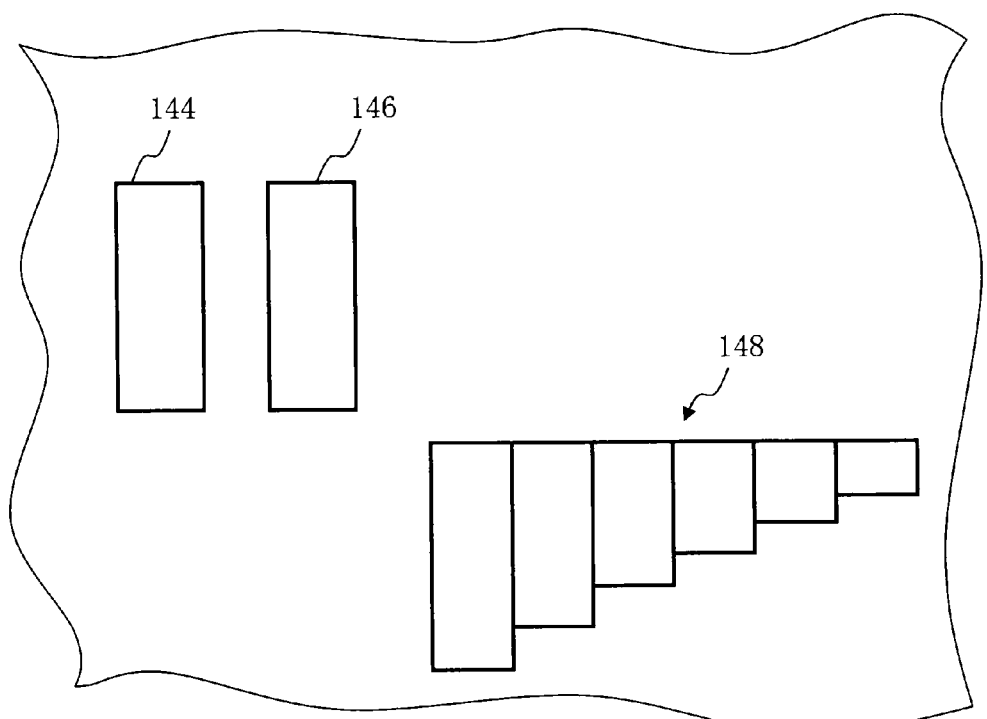
FIG. 5 shows a non-arbitrary-angle figure included in the CAD data shown in FIG. 3.
Figure 6:
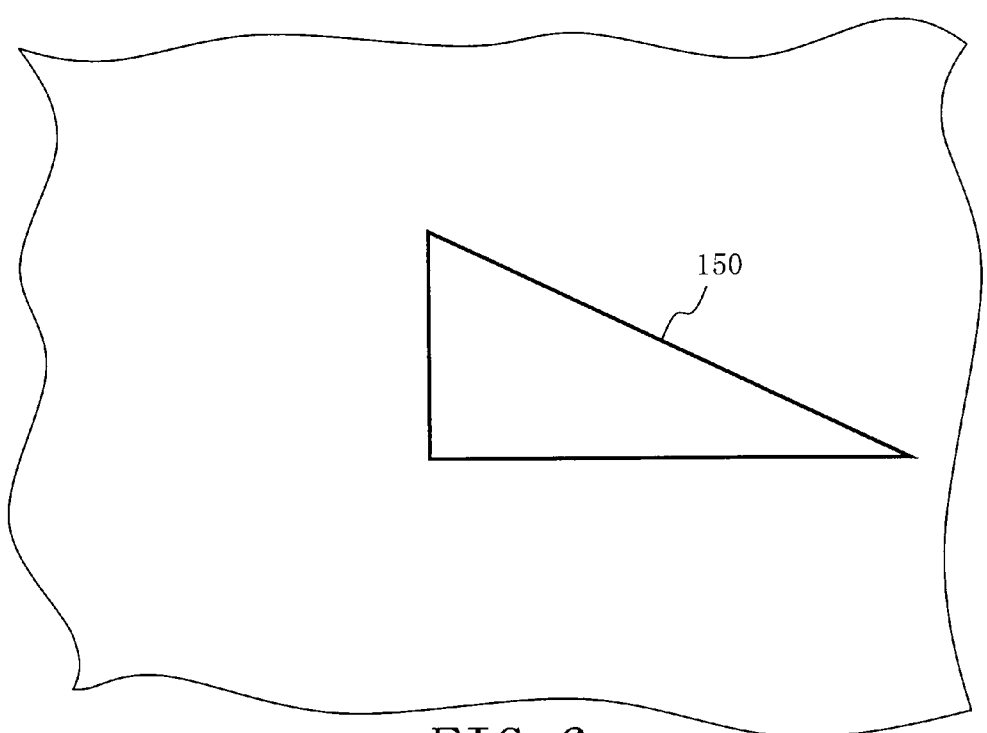
FIG. 6 shows an arbitrary-angle figure included in the CAD data shown in FIG. 3.

Next, as a sorting step, the CAD data sorting circuit 112 sorts the figures included in the CAD data 12 into at least one arbitrary-angle figure and at least one non-arbitrary-angle figure. FIG. 5 shows the non-arbitrary-angle figures included in the CAD data shown in FIG. 3. FIG. 6 shows the arbitrary-angle figure included in the CAD data shown in FIG. 3. In FIG. 5, only the non-arbitrary-angle figures included in the CAD data 10 are left to be defined. That is, only the figures 144, and 146 and the figure group 148 are defined. The CAD data sorting circuit 112 creates a file 42 in which only the non-arbitrary-angle figures are defined, and stores it in the memory 106. In FIG. 6, only the arbitrary-angle figure 150 included in the CAD data 10 is newly defined. The CAD data sorting circuit 112 creates a file 32 in which only the arbitrary-angle figure 150 is defined, and stores it in the memory 106.

On the other hand, the writing data sorting circuit 114 sorts the figures included in the writing data 12 into a figure group (at least one first figure) for the arbitrary-angle figures mentioned above and a figure group (at least one second figure) for the non-arbitrary-angle figure mentioned above.

Figure 7:
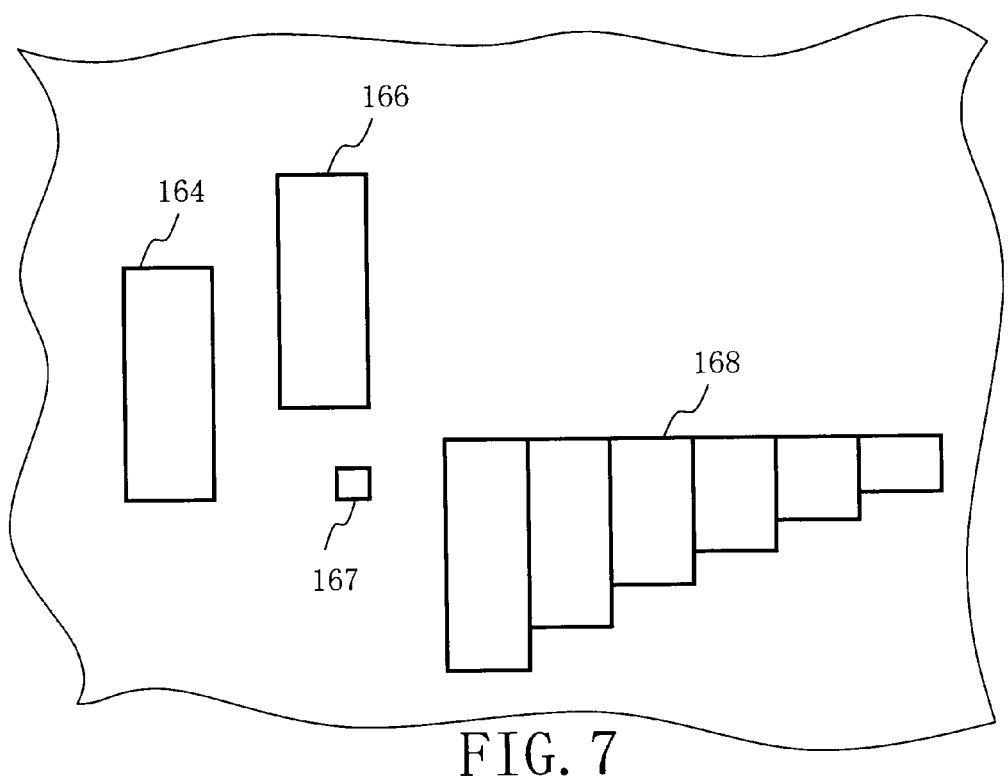
FIG. 7 shows a figure group corresponding to the non-arbitrary-angle figure included in the writing data shown in FIG. 4.
Figure 8:
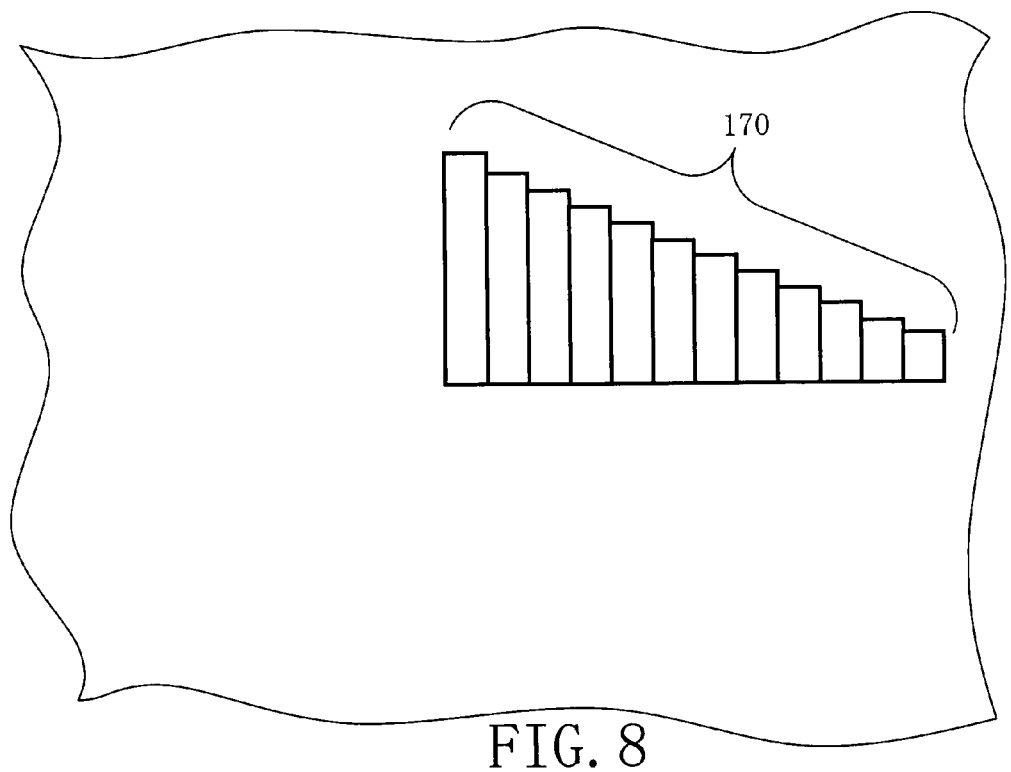
FIG. 8 shows a slit-like divided figure group corresponding to the arbitrary-angle figure included in the writing data shown in FIG. 4.

FIG. 7 shows a figure group corresponding to the non-arbitrary-angle figures included in the writing data shown in FIG. 4. FIG. 8 shows a slit-like divided figure group corresponding to the arbitrary-angle figure included in the writing data shown in FIG. 4. In FIG. 7, only the figures corresponding to the non-arbitrary-angle figures included in the writing data 12 are left to be defined. That is, only the figures 164, 166, and 167 and the figure group 168 are defined. The writing data sorting circuit 114 creates a file 44 in which only the non-arbitrary-angle figures are defined, and stores it in the memory 106. In FIG. 8, only the slit-like divided figure group 170 corresponding to the arbitrary-angle figure included in the writing data 12 is newly defined. The writing data sorting circuit 114 creates a file 34 in which only the slit-like divided figure group 170 is defined, and stores it in the memory 106.

Next, as an XOR operation step, the XOR operation circuit 122 reads the data file 32 of the arbitrary-angle figure, and the data file 34 of the slit-like divided figure group from the memory 106. Then, an XOR operation is performed between the data of the arbitrary-angle figure included in the file 32 and the data of the slit-like divided figure group included in the file 34. On the other hand, the XOR operation circuit 124 reads the data file 42 of the non-arbitrary-angle figure, and the data file 44 of the non-arbitrary angle from the memory 106. Then, an XOR operation is performed between the data of the non-arbitrary-angle figure included in the file 42 and the data of the non-arbitrary angle included in the file 44.

As a removal step, the error removal circuit 132 removes figures of the size smaller than a first allowable error value from the figures produced as a result of the operation between the data of the arbitrary-angle figure and the data of the slit-like divided figure group corresponding to the arbitrary-angle figure data. It is preferable to use an approximation error value of the arbitrary angle portion as the first allowable error value. Since the approximation error value of the arbitrary angle portion can be estimated to some extent from the conversion parameter, it is suitable to use the value as the first allowable error value.

Figure 9:
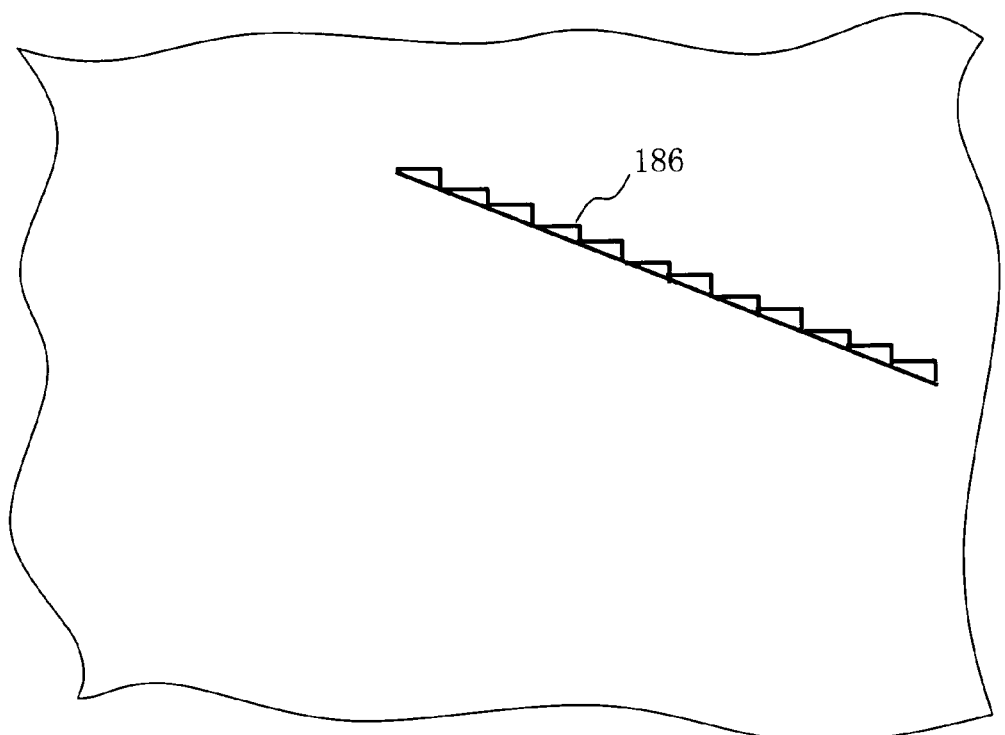
FIG. 9 shows an example of an operation result of an arbitrary angle portion described in Embodiment 1.

FIG. 9 shows an example of the operation result of the arbitrary angle portion described in Embodiment 1. When a conversion error occurred between the figures shown in FIG. 6 and FIG. 8, an arbitrary-angle figure group 186 being an error amount of the arbitrary angle remains and is output as result data 51 as shown in FIG. 9. Thus, when there is a figure of the size larger than the approximation error value of the arbitrary angle portion, it can be detected as an error figure. If the arbitrary angle is appropriately approximated within the allowable error, since the arbitrary-angle figure group 186 is removed, no figure is output as the result data 51. In that case, it can be judged that no conversion error has been generated with respect to the arbitrary angle portion.

On the other hand, the error removal circuit 134 removes figures of the size smaller than a second allowable error value from the figures produced as a result of the operation between the data of the non-arbitrary-angle figure and the data of the figure corresponding to the non-arbitrary-angle figure data. It is preferable to use the maximum error value which is estimated to be generated in converting an AU, as the second allowable error value. In particular, as the second allowable error value, it is preferable to use the maximum of the error generated when rounding the values in the AU conversion.

Furthermore, the first allowable error value is a value of the error which can be assumed to be generated by the slit-like dividing of the arbitrary angle and is generally larger than the second allowable error.

Figure 10:
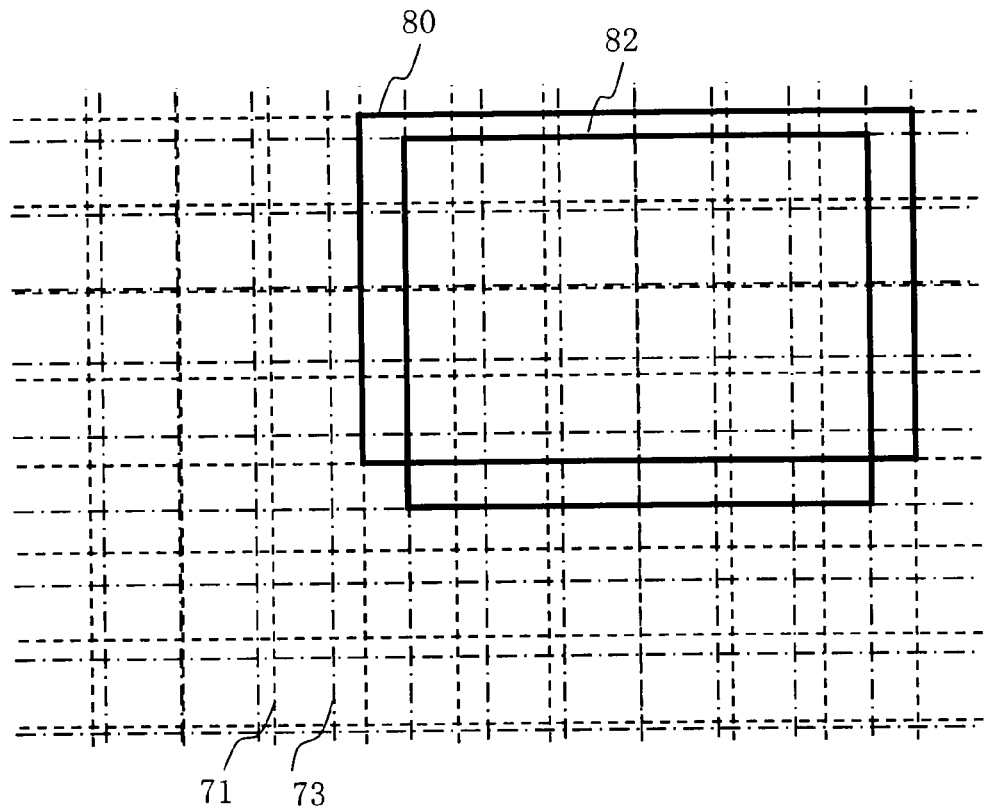
FIG. 10 shows an example of a figure on the grid of CAD data and a figure on the grid of writing data.

FIG. 10 shows an example of the figure on the grid of CAD data, and the figure on the grid of writing data. In FIG. 10, a figure 80 is defined by a grid 71 which is drawn in lattice by the AU of the CAD data 10. When the figure 80 is converted into the writing data 12, it becomes a figure 82. The figure 82 is defined by a grid 73 which is drawn in lattice by the AU of the writing data 12. An error arises before and after this data conversion by the change of the AU.

Figure 11:
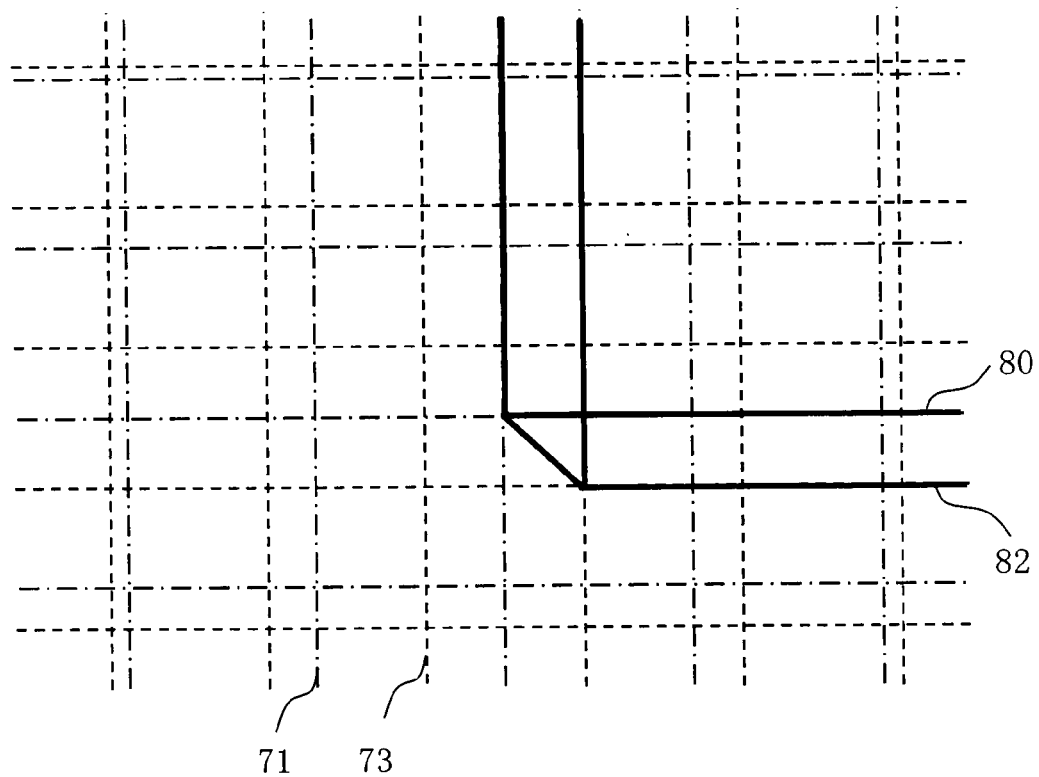
FIG. 11 shows a figure obtained by enlarging a part of the figure in FIG. 10.

FIG. 11 shows a figure obtained by enlarging a part of the figure in FIG. 10. Since the defined figures depend upon the AU of each data, an error ±0.5 of the AU may be generated as shown in FIG. 11. Therefore, such error of one AU serves as a conversion error value of the AU. Thus, by removing figures of the size smaller than the conversion error value of the AU, it becomes possible to eliminate the figures produced by the error.

Figure 12:
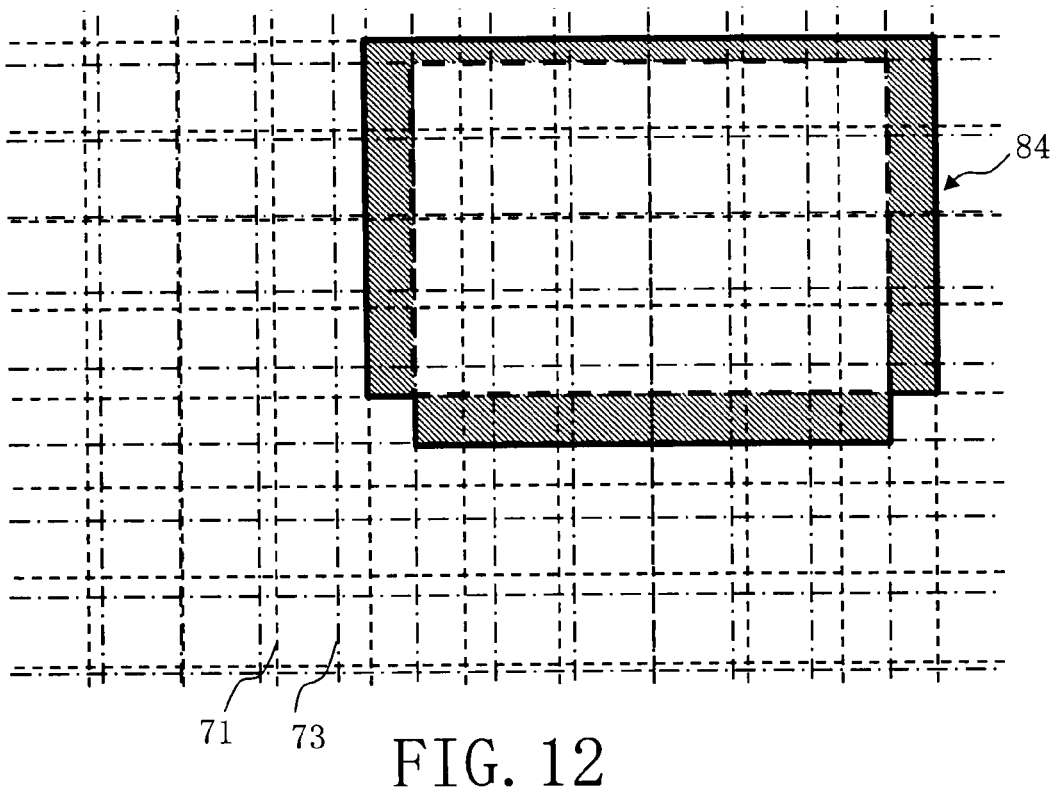
FIG. 12 shows an AU conversion error of the figure in FIG. 10.

FIG. 12 shows the AU conversion error portion detected as a result of the XOR operation of the figure of FIG. 10. A figure 84 of the area shown in slash lines is a figure produced by the AU conversion error. The amount of data to be verified can be reduced by removing the figure produced by this AU conversion error from the XOR operation result.

Figure 13:
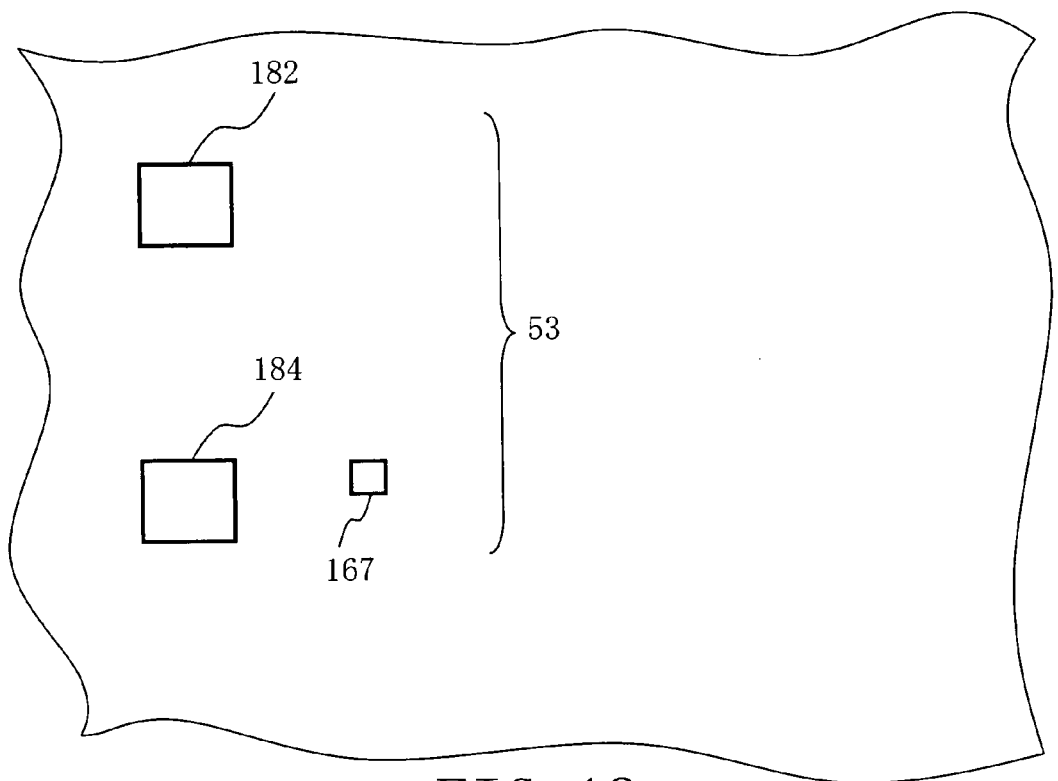
FIG. 13 shows an example of an operation result of the non-arbitrary angle portion described in Embodiment 1.

FIG. 13 shows an example of an operation result of the non-arbitrary angle portion described in Embodiment 1. Since there is a displacement between the figures 144 and 164 in FIGS. 5 and 7, figures 182 and 184 showing the displaced amount are output as the result data 53. Furthermore, as the error value is herein set up independently of the arbitrary-angle figure, the figures 167 of the size smaller than the approximation error value of the arbitrary angle portion can also be detected as an error figure. Since the AU conversion error in the case of the error figure becoming the minimum is set up as a threshold, an error detection can be performed in high precision.

As an output step, the verification part 100 outputs a result after the removal. The output may be outputted outside through the I/F circuit 104 or may be displayed on the monitor 102. Owing to the configuration stated above, it becomes possible to perform highly precise data verification.

The approximation error value of the arbitrary angle part is not herein restricted to being set as a unique value. The approximation error value of the arbitrary angle portion may be changed according to a value of the arbitrary angle. That is, as the first allowable error value, it is preferable to use a different value according to the value of the arbitrary angle.

Figure 14:
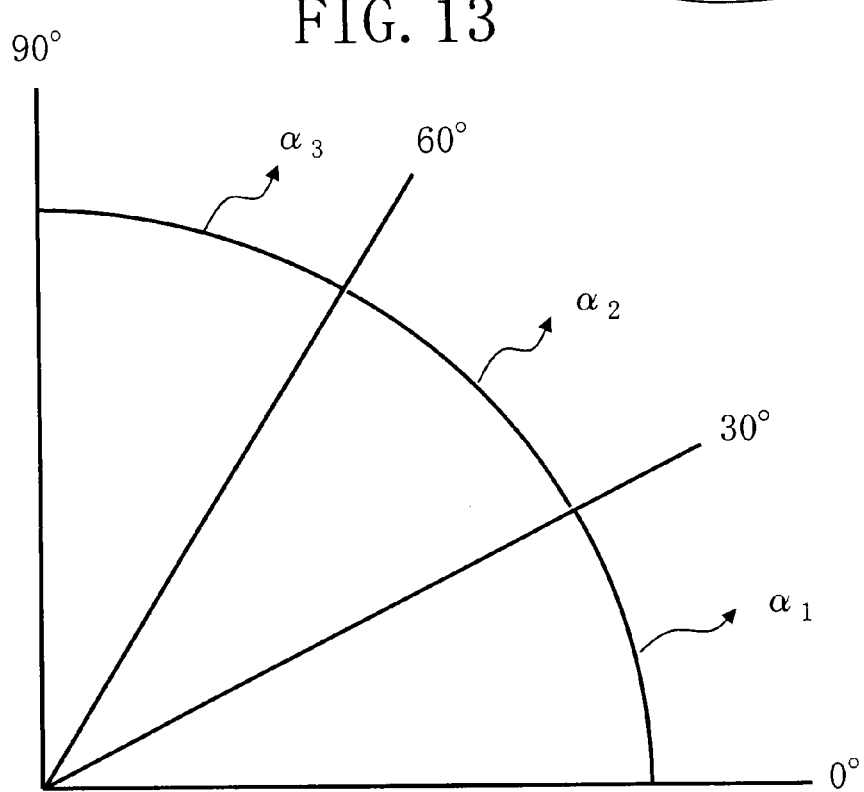
FIG. 14 shows a relation between an arbitrary angle and an error value described in Embodiment 1.

FIG. 14 shows a relation between the arbitrary angle and the error value described in Embodiment 1. As shown in FIG. 14, by grouping angles according to a predetermined extent, an approximation error value of the arbitrary angle portion is set for each group. For example, an error value $\alpha 1$ is used for the degrees from 0 to less than or equal to 30. An error value $\alpha 2$ is used for the degrees from greater than 30 to less than or equal to 60 degrees. An error value $\alpha 3$ is used for the degrees from greater than 60 to less than or equal to 90 degrees. With respect to degrees subsequent to 90 degrees, it may be set similarly. It is also preferable for the error removal circuit 132 to perform processing by use of the error value of the corresponding group according to the angle of the arbitrary-angle figure.

As mentioned above, according to the present Embodiment, since the figures are sorted into the arbitrary-angle figure and the non-arbitrary-angle figure, it is possible to independently set up the size of the figure to be removed in the area where the arbitrary-angle figures are arranged and in the area where the non-arbitrary-angle figures are arranged. Therefore, in the area where the non-arbitrary-angle figures are arranged, an error figure smaller than the arbitrary angle error can be discovered. Accordingly, a conversion error can be verified with high precision.

Embodiment 2

In the above Embodiment 1, an XOR operation is performed after sorting the figures into the arbitrary-angle figure and the non-arbitrary-angle figure. However, it is not limited thereto. In the configuration according to the present Embodiment 2, figures are sorted into the arbitrary-angle figure and the non-arbitrary-angle figure after performing an XOR operation, which will be described below.

Figure 15:
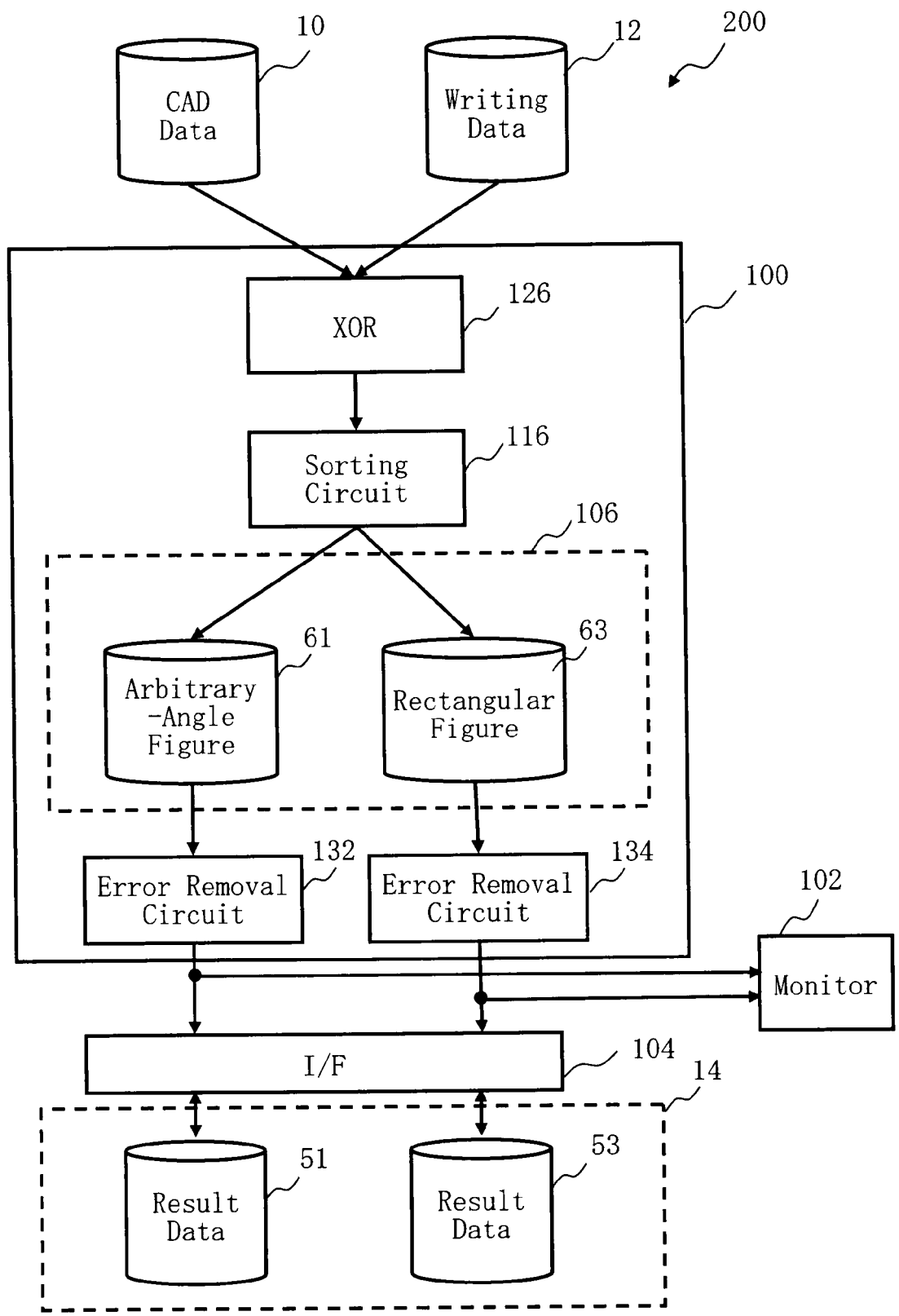
FIG. 15 is a schematic diagram showing an example of the internal structure of a data verification apparatus described in Embodiment 2.

FIG. 15 is a schematic diagram showing an example of the internal structure of a data verification apparatus described in Embodiment 2. In FIG. 15, the verification part 100 includes a sorting circuit 116 (sorting part), the memory 106, an XOR operation circuit 126 (operation part), the error removal circuit 132 (first removal part), and the error removal circuit 134 (second removal part).

First, as an input step, the verification part 100 inputs the CAD data 10. Then, the inputted CAD data 10 is sent to the XOR operation circuit 126. On the other hand, the verification part 100 inputs the writing data 12 which was converted from the CAD data 10. The inputted writing data 12 is also sent to the XOR operation circuit 126. In FIG. 15, although the XOR operation circuit 126 inputs the data directly, it is also acceptable to input the data through the I/F circuit 104.

As an XOR operation step, the XOR operation circuit 126 performs an XOR operation between the data of a figure included in the CAD data 10 and the data of a figure included in the writing data 12. This process is repeated for all the figures included in the CAD data 10. That is, this process is repeated for all the figures included in the writing data 12.

Next, as a sorting step, the sorting circuit 116 sorts the figures produced as a result of the operation into at least one arbitrary-angle figure and at least one non-arbitrary-angle figure. Then, if an XOR operation is performed between the arbitrary-angle figure and a slit-like divided figure, the arbitrary-angle figure certainly remains. Therefore, when there is an arbitrary-angle figure included in the operation result, it can be judged that the area concerned has been the arbitrary angle part from the first. The sorting circuit 116 creates a file 61 in which only the arbitrary-angle figures are defined, and stores it in the memory 106. On the other hand, the sorting circuit 116 creates a file 63 in which only the non-arbitrary-angle figures are defined, and stores it in the memory 106.

As a removal step, the error removal circuit 132 reads the file 61, in which only the arbitrary-angle figures are defined, from the memory 106. Then, figures of the size smaller than a first allowable error value are removed from the figures defined in the file 61. As well as Embodiment 1, it is preferable to use an approximation error value of the arbitrary angle portion as the first allowable error value.

On the other hand, the error removal circuit 134 reads the file 63, in which only the non-arbitrary-angle figures are defined, from the memory 106. Then, figures of the size smaller than a second allowable error value are removed from the figures defined in the file 63. As well as Embodiment 1, it is preferable to use an Au conversion error value as the second allowable error value.

As an output step, the verification part 100 may just output a result after the removal like Embodiment 1.

Even with the configuration described above, since the arbitrary-angle figure and the non-arbitrary-angle figure independently set up the error values respectively, it is possible to perform highly precise data verification like Embodiment 1.

What is represented by the word "part", "circuit", or "step" in the above description can be configured by a computer program. It may be executed by a software program, or alternatively by any combination of software, hardware and/or firmware. When configured by a program, the program is recordable on a recording medium, such as a magnetic disk drive, a magnetic tape drive, an FD, or a ROM (Read Only Memory).

Figure 16:
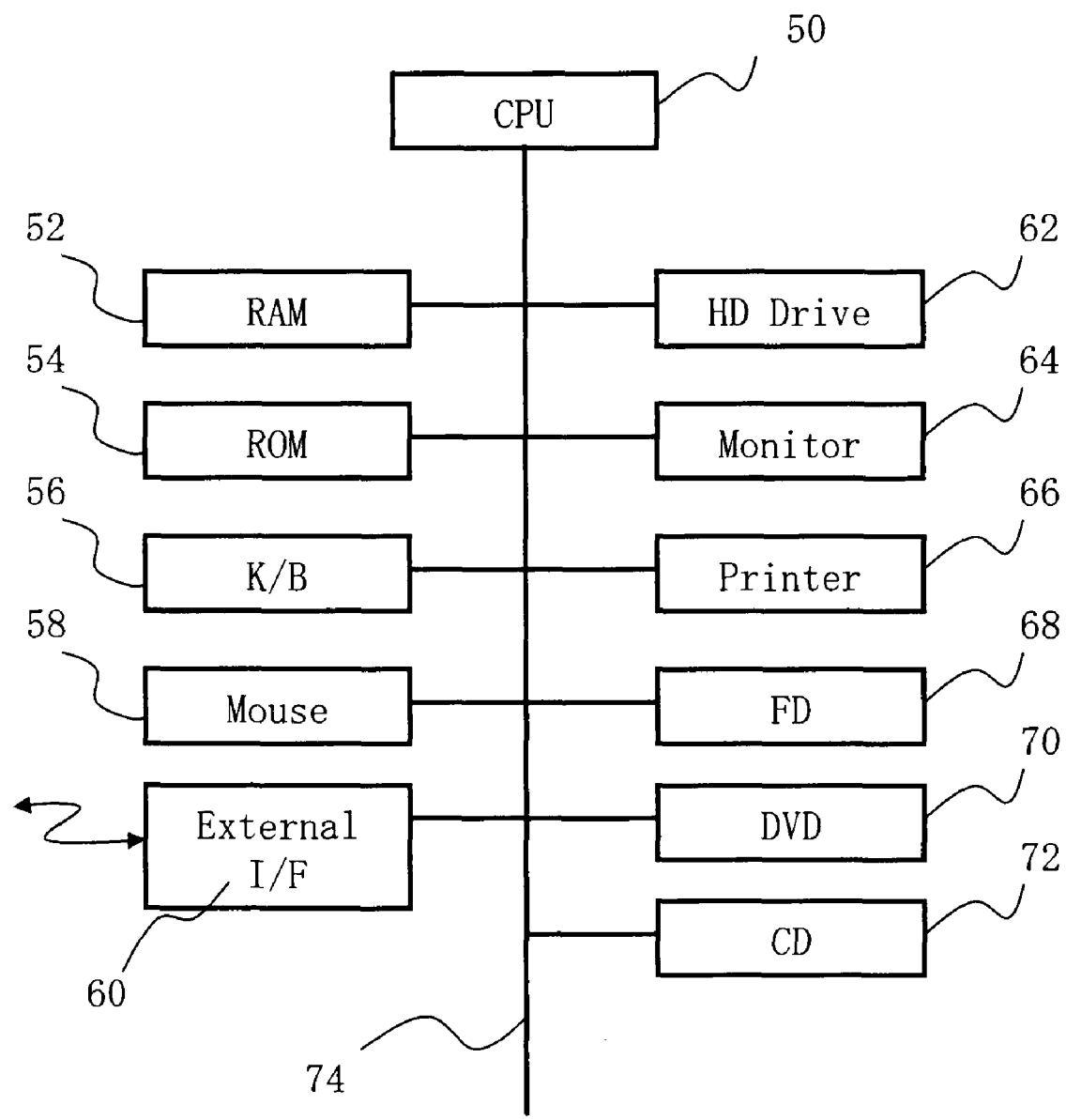
FIG. 16 is a block diagram showing an example of a hardware structure when configured by a program.
Figure 17:
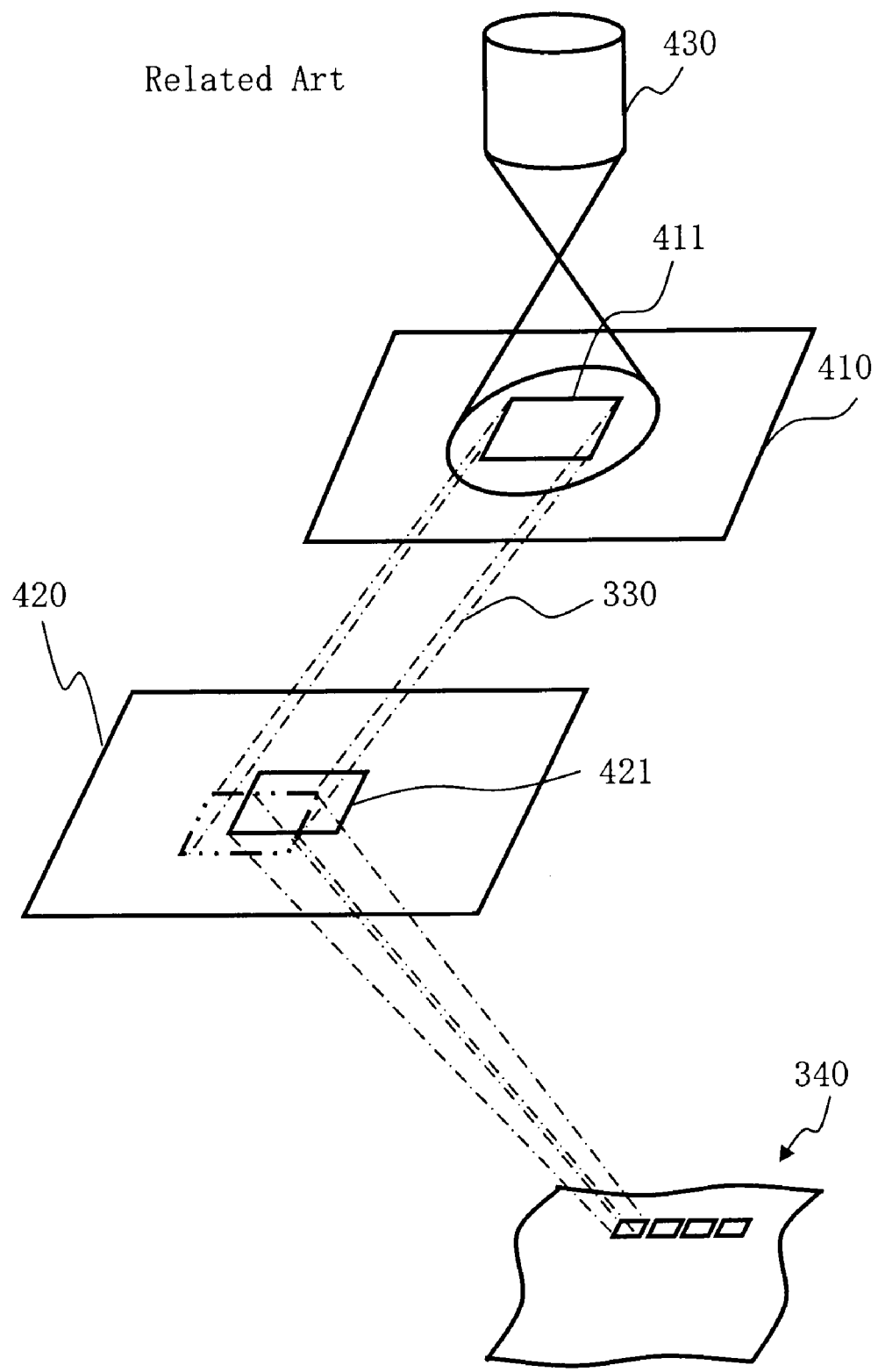
FIG. 17 shows a schematic diagram for describing an operation of a conventional variable-shaped electron beam pattern writing apparatus.
Figure 18:
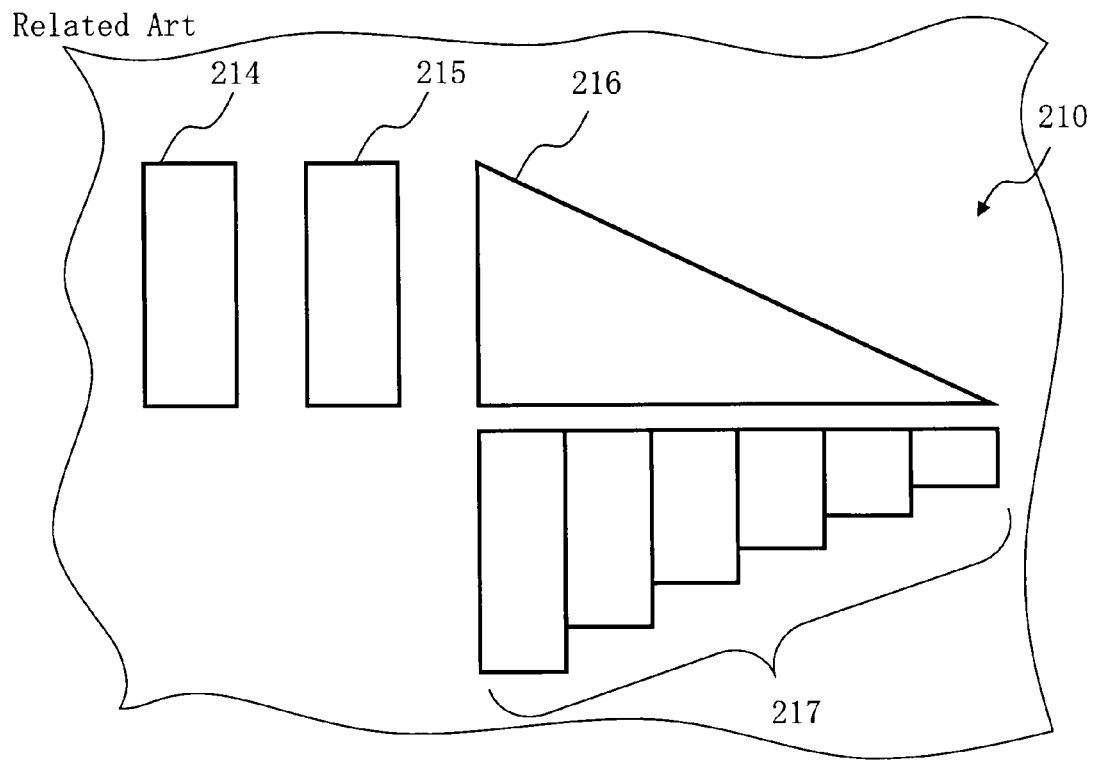
FIG. 18 shows an example of design data.
Figure 19:
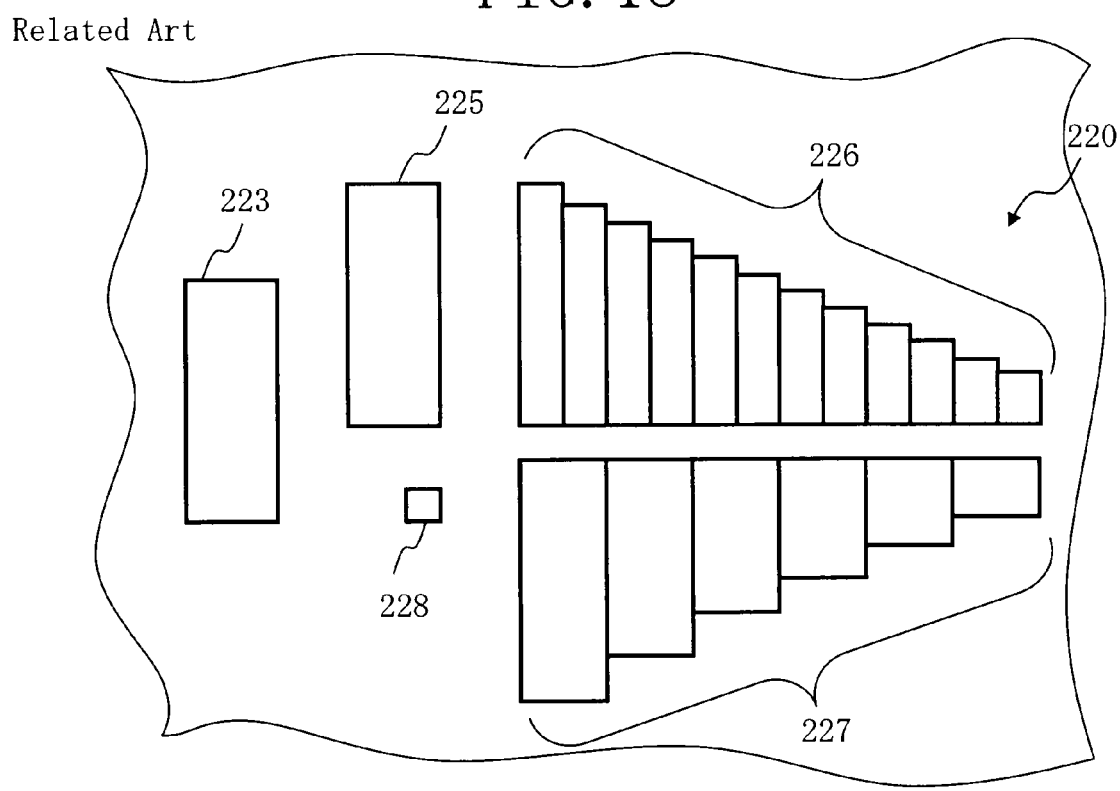
FIG. 19 shows an example of writing data after conversion.
Figure 20:
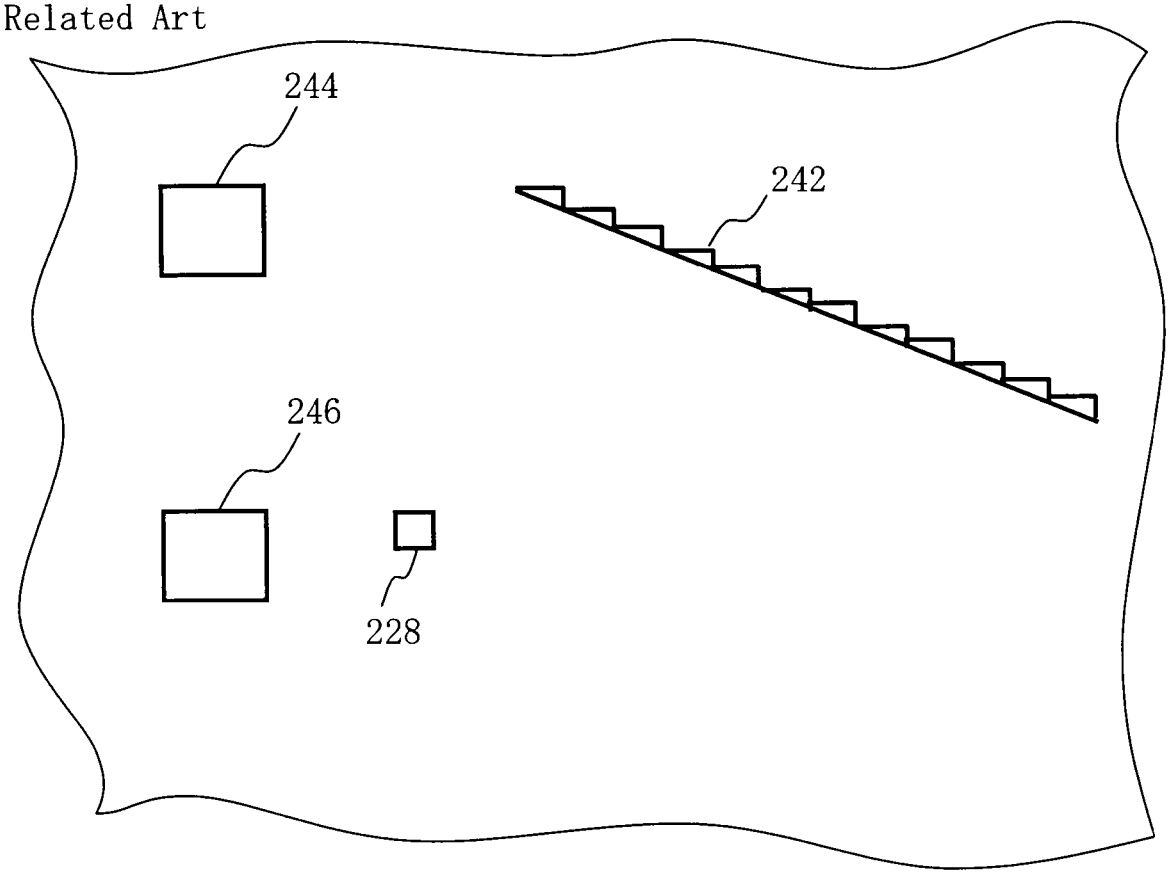
FIG. 20 shows an example of an operation result.
Figure 21:
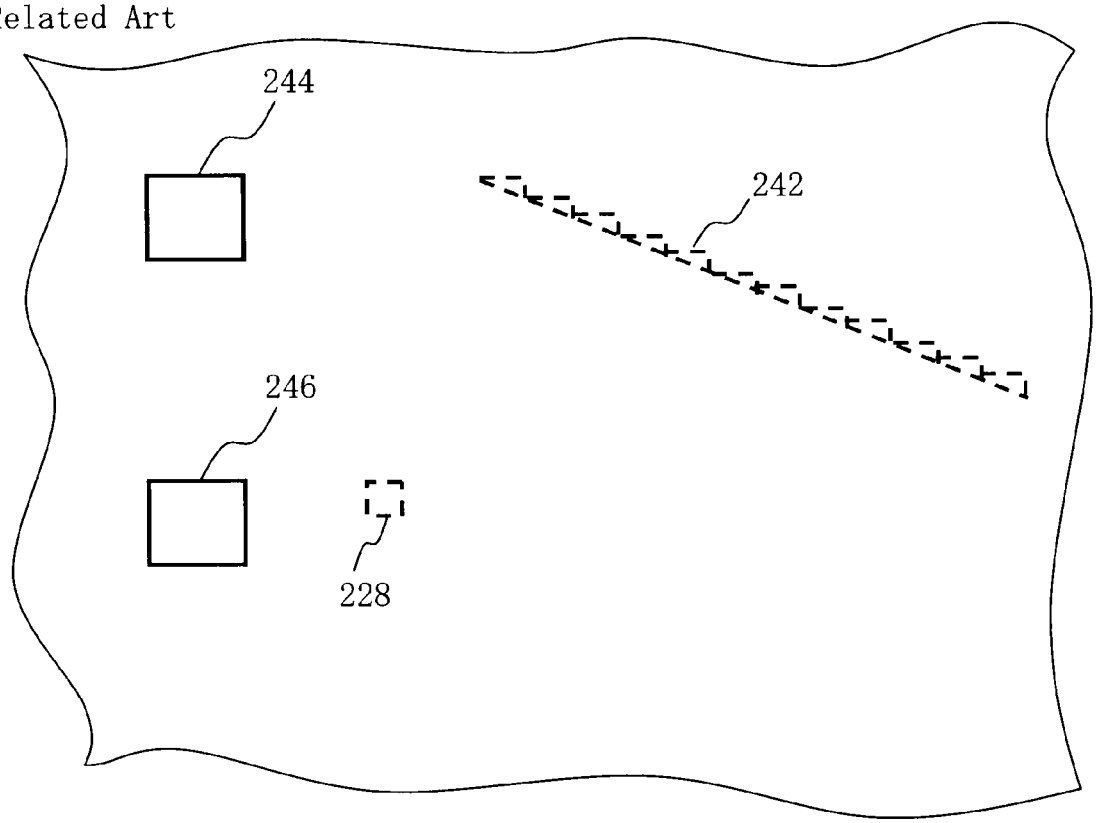
FIG. 21 shows another example of the operation result.

FIG. 16 is a block diagram showing an example of a hardware structure when configured by a program. A CPU 50 being a computer, through a bus 74, is connected to a RAM (Random Access Memory) 52, a ROM 54, a magnetic disk (HD) drive 62, a keyboard (K/B) 56, a mouse 58, an external interface (I/F) 60, a monitor 64, a printer 66, an FD 68, a DVD 70, and a CD 72. The RAM 52, ROM 54, magnetic disk (HD) drive 62, FD 68, DVD 70, and CD 72 are examples of a storage device. The keyboard (K/B) 56, mouse 58, external interface (I/F) 60, FD 68, DVD 70, and CD 72 are examples of an input means. The external interface (I/F) 60, monitor 64, printer 66, FD 68, DVD 70, and CD 72 are examples of an output means. It may be configured so that operations performed by each circuit in the verification part 100 can be executed by the CPU 50. Then, input data operated in the CPU 50 may be stored in a storage device such as the RAM 52.

As mentioned above, the embodiments have been described with reference to concrete examples. However, the present invention is not limited these concrete examples.

Moreover, although description of the apparatus structure, control method, etc. not directly required for explaining the present invention is omitted, it is possible to suitably select and use some or all of them when needed. For example, as to the structure of the data verification apparatus 200, it should be understood that a necessary control unit structure can be appropriately selected and used.

In addition, any generation method of electron beam writing data, conversion method of electron beam writing data, and devices therefor that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A figure data verification apparatus comprising:
a first sorting part configured to input design data and sort figures included in the design data to at least one arbitrary-angle figure having at least one angle not being an integral multiple of 45 degrees and to at least one non-arbitrary-angle figure all angles of which are integral multiples of 45 degrees;
a second sorting part configured to input writing data converted from the design data, and sort figures included in the writing data to at least one first figure corresponding to the at least one arbitrary-angle figure and to at least one second figure corresponding to the at least one non-arbitrary-angle figure;
a first operation part configured to perform an exclusive OR operation between data of the arbitrary-angle figure and data of the first figure;
a second operation part configured to perform an exclusive OR operation between data of the non-arbitrary-angle figure and data of the second figure;
a first removal part configured to remove a figure of a size smaller than a first allowable error value from at least one figure produced as a result of the exclusive OR operation between the data of the arbitrary-angle figure and the data of the first figure; and
a second removal part configured to remove a figure of a size smaller than a second allowable error value from at least one figure produced as a result of the exclusive OR operation between the data of the non-arbitrary-angle figure and the data of the second figure.

2. The apparatus according to claim 1, wherein the second allowable error value is smaller than the first allowable error value.

3. The apparatus according to claim 2, wherein the first allowable error value changes according to a value of an arbitrary angle.

4. The apparatus according to claim 1, wherein the writing data has been converted into input format data of a pattern writing apparatus which writes a figure pattern onto a target workpiece by using charged particle beams.

5. A figure data verification apparatus comprising:
an operation part configured to input design data and writing data converted from the design data and perform an exclusive OR operation between data of a figure included in the design data and data of a figure included in the writing data;
a sorting part configured to sort figures produced as a result of the exclusive OR operation to at least one arbitrary-angle figure having at least one angle not being an integral multiple of 45 degrees and to at least one non-arbitrary-angle figure all angles of which are integral multiples of 45 degrees;
a first removal part configured to remove a figure of a size smaller than a first allowable error value from the at least one arbitrary-angle figure; and
a second removal part configured to remove a figure of a size smaller than a second allowable error value from the at least one non-arbitrary-angle figure.

6. The apparatus according to claim 5, wherein the second allowable error value is smaller than the first allowable error value.

7. The apparatus according to claim 6, wherein the first allowable error value changes according to a value of an arbitrary angle.

8. The apparatus according to claim 5, wherein the writing data has been converted into input format data of a pattern writing apparatus which writes a figure pattern onto a target workpiece by using charged particle beams.

9. A figure data verification method comprising:
inputting design data;
inputting writing data converted from the design data;
sorting figures included in the design data to at least one arbitrary-angle figure having at least one angle not being an integral multiple of 45 degrees and to at least one non-arbitrary-angle figure all angles of which are integral multiples of 45 degrees;
sorting figures included in the writing data to at least one first figure corresponding to the at least one arbitrary-angle figure and to at least one second figure corresponding to the at least one non-arbitrary-angle figure;
performing, with an electric circuit or a computer, an exclusive OR operation between data of the arbitrary-angle figure and data of the first figure;
performing, with an electric circuit or the computer, an exclusive OR operation between data of the non-arbitrary-angle figure and data of the second figure;
removing a figure of a size smaller than a first allowable error value from at least one figure produced as a result of the exclusive OR operation between the data of the arbitrary-angle figure and the data of the first figure; and
removing a figure of a size smaller than a second allowable error value from at least one figure produced as a result of the exclusive OR operation between the data of the non-arbitrary-angle figure and the data of the second figure to output a result of the removing.

10. A figure data verification method comprising:
inputting design data;
inputting writing data converted from the design data;
performing, with an electric circuit or a computer, an exclusive OR operation between data of a figure included in the design data and data of a figure included in the writing data;
sorting figures produced as a result of the exclusive OR operation to at least one arbitrary-angle figure having at least one angle not being an integral multiple of 45 degrees and to at least one non-arbitrary-angle figure all angles of which are integral multiples of 45 degrees;
removing a figure of a size smaller than a first allowable error value from the at least one arbitrary-angle figure; and
removing a figure of a size smaller than a second allowable error value from the at least one non-arbitrary-angle figure to output a result of the removing.

* * * * *